United States Patent
Amrutur et al.

(10) Patent No.: US 8,063,701 B2
(45) Date of Patent: Nov. 22, 2011

(54) SYSTEM FOR REDUCING DISTORTION IN AN ELECTRONIC CIRCUIT USING NONLINEAR FEEDBACK

(75) Inventors: Bharadwaj Amrutur, Bangalore (IN); Madhusudan Srinivasan, Chennai (IN); K. Bhavani Pradeep, Hyderabad (IN)

(73) Assignee: Indian Institute of Science (IN)

( * ) Notice: Subject to any disclaimer, the term of this patent is extended or adjusted under 35 U.S.C. 154(b) by 24 days.

(21) Appl. No.: 12/649,474

(22) Filed: Dec. 30, 2009

(65) Prior Publication Data

US 2011/0115559 A1  May 19, 2011

(30) Foreign Application Priority Data

Nov. 17, 2009  (IN) .......................... 2823/CHE/2009

(51) Int. Cl.
*H03F 1/26* (2006.01)
(52) U.S. Cl. ........................................................ 330/149
(58) Field of Classification Search .................. 330/149, 330/252, 260
See application file for complete search history.

(56) References Cited

U.S. PATENT DOCUMENTS

| | | | |
|---|---|---|---|
| 5,216,354 A | | 6/1993 | DeGuelle |
| 6,104,242 A | * | 8/2000 | Ezell ............................. 330/252 |
| 6,271,688 B1 | * | 8/2001 | Marchese et al. ............... 327/65 |
| 7,102,442 B2 | * | 9/2006 | Anderson ..................... 330/285 |

OTHER PUBLICATIONS

Low-voltage CMOS Transconductance Cell Based on Parallel Operation of Triode and Saturation Transconductors, by A. Coban and P. Allen, Electronics Letters, vol. 30, No. 14, pp. 1124-1126, Jul. 1994.
A 1-V 50-MHz Pseudodifferential OTA with Compensation of the Mobility Reduction, by T.-Y. Lo and C.-C. Hung, IEEE Transactions on Circuits and Systems-II: Express Briefs, vol. 54, No. 12, pp. 1047-1051, Dec. 2007.

(Continued)

*Primary Examiner* — Robert Pascal
*Assistant Examiner* — Khiem Nguyen
(74) *Attorney, Agent, or Firm* — McDonnell Boehnen Hulbert & Berghoff LLP

(57) ABSTRACT

System and methods for reducing third harmonic distortion produced by nonlinear amplifiers are disclosed. A system may include an amplifier circuit with an amplifier transistor such that the amplifier is capable of exhibiting an amplifier output signal containing third harmonic distortion. Further, a system may include a nonlinear feedback circuit with a first feedback transistor operating in Triode mode that produces a feedback electronic signal containing a feedback third harmonic component. In addition, the nonlinear feedback circuit may be configured to the amplifier circuit in negative feedback such that the feedback third harmonic component of the feedback electronic signal reduces the third harmonic distortion of the amplifier output signal. A system may also provide an output signal that has less third harmonic distortion than the amplifier output signal.

17 Claims, 11 Drawing Sheets

OTHER PUBLICATIONS nalysis and Design of Analog Integrated Circuits by P. R. Gray, P. J.
OTA Linearity Enhancement Technique for High Frequency Applications with IM3 Below-65db, by A. Lewinski and J. Silva-Martinez, IEEE Transactions on Circuits and Systems II: Express Briefs, vol. 51, No. 10, pp. 542-548, Oct. 2004.

The Design and Implementation of Low-power CMOS Radio Receivers, by D. K. Shaeffer Ph.D. dissertation, Stanford university, Dec. 1998.

A 4-MHz CMOS Continuous-time Filter with On-chip Automatic Tuning, by F. Krummenacher and N. Joehl, IEEE Journal of Solid-State Circuits, vol. 23, No. 3, pp. 750-758, Jun. 1988.

Distortion in Elementary Transistor Circuits, by W. Sansen, IEEE Transactions on Circuits and Systems-II, vol. 46, No. 3, pp. 315-325, Mar. 1999.

RF Microelectronics, by B. Razavi, Prentice Hall, 1998, Ch. 9 p. 298-322. Hurst, S. H. Lewis, and R. G. Meyer. Wiley, 2001, Ch. 2.9, p. 131-143; Ch. 3.5, p. 215-245; Ch. 4.3.5, p. 287-298; Ch. 6.1, p. 405-418, and Ch. 12, p. 808-865.

MOSFET Modeling for Analog Circuit CAD: Problems and Prospects, by Y. Tsividis and K. Suyama, IEEE Journal of Solid-State Circuits, vol. 29, No. 3, pp. 210-216, Mar. 1994.

Palumbo et al., "Harmonic Distortion in Non-Linear Amplifier with Non-Linear Feedback", International Journal of Circuit Theory and Applications, vol. 26, Issue 3, pp. 293-299, May/Jun. 1998.

International Search Report and Written Opinion prepared by the Australian Patent Office in PCT/IB2010/054081, mailed Dec. 1, 2010.

* cited by examiner

US 8,063,701 B2

SYSTEM FOR REDUCING DISTORTION IN AN ELECTRONIC CIRCUIT USING NONLINEAR FEEDBACK

CROSS-REFERENCE TO RELATED APPLICATION

The present application claims priority under 35 U.S.C. §119 to a corresponding patent application filed in India and having application number 2823/CHE/2009, filed on Nov. 17, 2009, the entire contents of which are herein incorporated by reference.

BACKGROUND

Modern telecommunication technologies require high performance electronic circuits to operate according to customer or market needs. For example, telecommunication applications such as asymmetrical subscriber lines (ADSL), cable modem, and video applications may be required to provide error free or near error free data with minimum latency to an end user. Usually, electronic circuits used in these applications meet specifications with stringent requirements to perform these types of services.

Likewise, telecommunication applications that deliver voice services, such as cellular telephone services, may require a certain level of signal clarity. However, many radio frequency (RF) electronic circuits used in a cellular telephone application may create distortion that decreases signal clarity as well as quality of service of cellular telephone applications.

Many times, RF electronic circuits include transistors or other electronic devices that exhibit both linear and nonlinear characteristics, and at times, the nonlinear characteristics may create distortion. An electronic system has a linear characteristic, for example, if a voltage output is proportional to a voltage input. However, a system exhibits nonlinear characteristics if an output is not proportional to an input. That is, a nonlinear system cannot be described using variables written in a linear combination of independent components. Instead, a nonlinear electronic system may have an output that is proportional the square and/or cube of the input. Examples of nonlinear electronic devices include diodes and transistors that provide nonlinear current/voltage (I/V) characteristics.

Some electronic circuits, such as amplifiers, not only increase an amplitude of signals at an operating frequency (e.g., $\omega$), but also exhibit nonlinearity such that the amplifiers create spurious electronic signals that are multiples or harmonics of the operating frequency $\omega_1$. Such spurious electronic signals (or harmonics) may be referred to as distortion.

In a cellular telephone system, for example, a cellular phone may receive and deliver voice service using a certain frequency within a frequency range or frequency band. Other cellular users may receive and deliver their own voice service in adjacent frequency bands. For example, a cellular application used by one user may specify that operating frequency $\omega_1$ should be within a frequency range $\omega_A$-$\omega_B$ while another cellular user may be using an application at another operating frequency within an adjacent frequency range $\omega_B$-$\omega_C$. Distortion components may be introduced in the adjacent frequency bands (i.e., $\omega_B$-$\omega_C$) and may create interference or decrease quality of signals used by cellular users due to closeness of frequency bands. Therefore, such telecommunication applications may require electronic circuits to minimize nonlinear characteristics so as to minimize distortion.

SUMMARY

The present disclosure includes systems, devices, and methods for reducing distortion in electronic circuits. In particular, aspects of the disclosure describe an electronic device that may include a nonlinear amplifier with nonlinear feedback as a method to reduce distortion of the electronic circuit.

One embodiment of the present disclosure may include a system for reducing third harmonic distortion. The system includes an amplifier circuit containing an amplifier transistor such that the amplifier circuit is capable of exhibiting an amplifier output signal that includes a third harmonic distortion. Further, the system includes a nonlinear feedback circuit with a first feedback transistor operating in Triode mode that produces a feedback electronic signal containing a feedback third harmonic component. In addition, the nonlinear feedback circuit is configured to the amplifier circuit in negative feedback such that the feedback third harmonic component of the feedback electronic signal reduces the third harmonic distortion of the amplifier output signal. The system further provides an output signal that has less third harmonic distortion than the amplifier output signal.

Another embodiment of the present disclosure includes a method for reducing a third harmonic distortion in an electronic device. The method includes receiving an amplifier output signal containing third harmonic distortion from an output node of an amplifier circuit at an input node of a nonlinear feedback circuit. A further step in the method includes producing a feedback electronic signal containing a feedback third harmonic component using the nonlinear feedback circuit. A first feedback transistor operating in Triode mode is a part of the nonlinear feedback circuit. In addition, the nonlinear feedback circuit is configured in negative feedback with the amplifier circuit such that the input node of the nonlinear feedback circuit is coupled to the output node of the amplifier circuit. An additional step in the method includes processing the amplifier output signal using the nonlinear feedback circuit. The processing step may combine the feedback electronic signal with the amplifier output signal to reduce the third harmonic distortion of the amplifier output signal. Another step in the method may include providing a device output signal that has less third harmonic distortion than the amplifier output signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
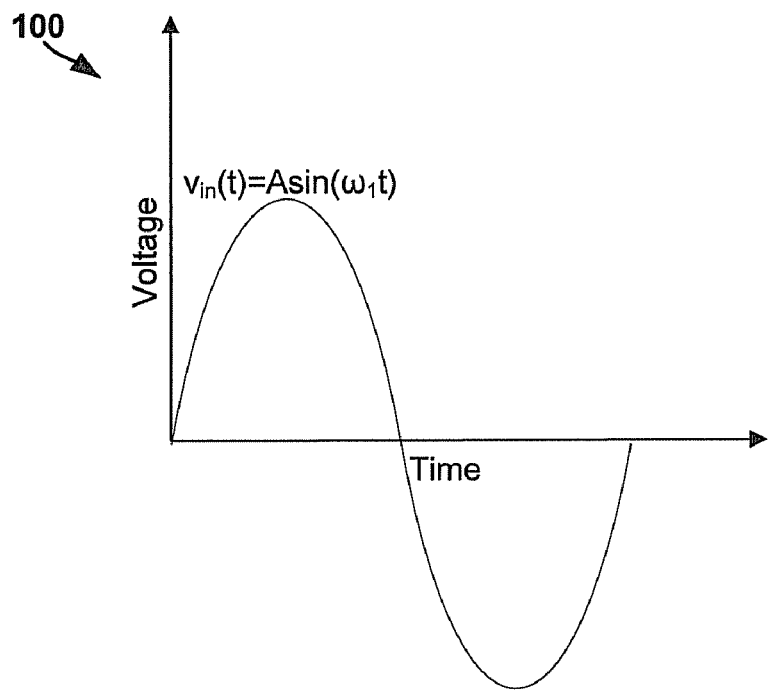
FIG. 1A-1B are example graphs of an analog electrical signal.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Aspects of the present application include an electronic circuit comprising an amplifier with nonlinear feedback that reduces the third harmonic distortion created by nonlinear effects of an amplifier with little or no increase in power consumption. Distortion in an amplifier may arise when an analog signal is applied to the amplifier input. For example, a nonlinear amplifier may have an analog input signal such as $v_{in}(t)=P\sin(\omega_1 t)$. A resulting amplifier output signal may not only include components at an operating frequency $\omega_1$ but also include components at frequencies $2\omega_1$, $3\omega_1$, $4\omega_1$, $5\omega_1$, etc. and other multiples of $\omega_1$ due to nonlinearity of the amplifier. Frequency components that are multiples of $\omega_1$ are called harmonics. Distortion components with frequencies that are 2, 4, 6, etc., multiples of the input signal frequency $\omega_1$ are called even-order harmonics (e.g., $2\omega_1$, $4\omega_1$, etc.). Alternatively, distortion components with frequencies that are 3, 5, 7, etc., multiples of the input signal frequency $\omega_1$ are called odd-order harmonics (e.g., $3\omega_1$, $5\omega_1$, etc.). In particular, a distortion component that has a frequency of $3\omega_1$ is called third harmonic distortion (HD3).

An example application for a nonlinear electronic circuit may be amplifying analog signals in RF applications in cellular telephone systems. In such applications, signals may be constrained to certain frequency bands. However, nonlinear effects of amplifying an analog signal may create spurious signals in adjacent frequency bands causing interference with other signals.

Figure 1B:
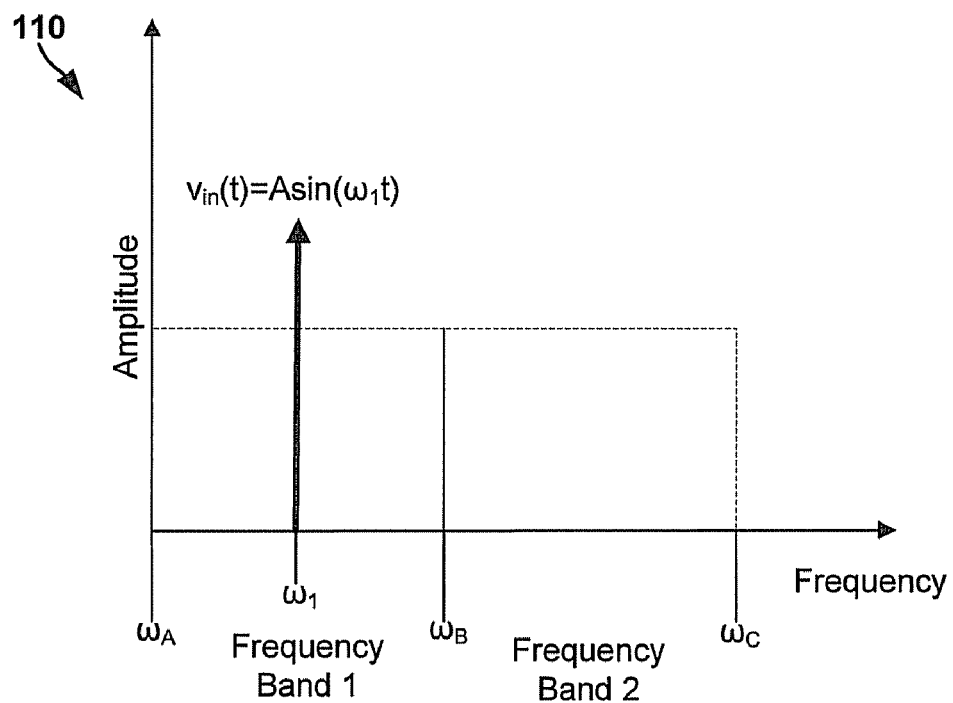

FIG. 1A is an example graph 100 of an analog signal. Specifically, the graph 100 illustrates a representation of $v_{in}(t)=P\sin(\omega_1 t)$ in the time domain. That is, the graph 100 shows a voltage level of $v_{in}(t)$ varying with time at an operating frequency of $\omega_1$. A signal $v_{in}(t)$ may be, for example, used in a cellular telephone system. FIG. 1B is another example graph 110 of an analog signal. However, instead of showing an analog signal in the time domain, the graph 110 illustrates $v_{in}(t)=P\sin(\omega_1 t)$ in the frequency domain. That is, the graph 110 shows an impulse function located at an operating frequency $\omega_1$ within Frequency Band 1 ($\omega_A$-$\omega_B$). A signal $v_{in}(t)$ may be constrained by a cellular telephone system to be only in Frequency Band 1. Further, FIG. 1B shows an adjacent Frequency Band 2 ($\omega_B$-$\omega_C$) that may be used by other system users. Thus, a goal when amplifying $v_{in}(t)$ may be to reduce and potentially cancel any spurious signals that are harmonics of the operating frequency $\omega_1$ that may be introduced into Frequency Band 2 created due to the nonlinearity characteristics of an amplifier.

Figure 1C:
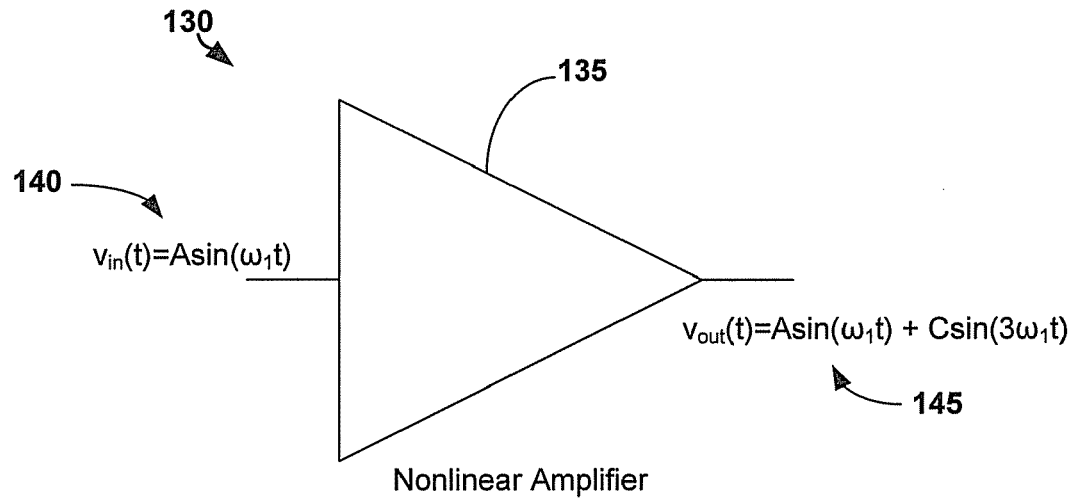
FIG. 1C is a block diagram of an example circuit including a nonlinear amplifier.

FIG. 1C is a block diagram of an example circuit 130 including a nonlinear differential amplifier circuit 135. The nonlinear differential amplifier 135 receives an analog signal input $v_{in}(t)$ 140 and delivers an analog output $v_{out}(t)$ 145. If $v_{in}(t)$ 140 is a small analog signal, then the output $v_{out}(t)$ 145 can be expressed in terms of $v_{in}(t)$ 140 using a Taylor Series approximation such as:

$$v_{out}(t)=a_1 v_{in}(t)+a_2 v_{in}^2(t)+a_3 v_{in}^3(t) \qquad (1)$$

Where:

$$a_n = \frac{1}{n!}\frac{d^n v_{out}}{dv_{in}}\bigg|_{v_{in}=0} \qquad (2)$$

The Taylor series approximation in Equation (1) may contain high order terms, however, the coefficients may be too small in magnitude to have significance in analyzing the amplifier 135 when a small signal input is applied. With $v_{in}(t)=P\sin(\omega_1 t)$ 140 and using mathematical manipulation and trigonometric identities, the nonlinearity of the amplifier provides the following output signal 145:

$$v_{out}(t)=A\sin(\omega_1 t)+B\sin(2\omega_1 t)+C\sin(3\omega_1 t) \qquad (3)$$

Where A, B, and C are constants proportional to coefficients $a_1$, $a_2$, and $a_3$ in Equation (1). Thus, the analog output signal $v_{out}(t)$ 145 may contain both second and third order harmonics as spurious signals created by the nonlinear characteristics of the amplifier 135. However, a nonlinear differential amplifier may suppress even-order harmonics. Thus, $v_{out}(t)=A\sin(\omega_1 t)+C\sin(3\omega_1 t)$ 145 and contains a first harmonic component as well as third harmonic distortion.

Figure 1D:
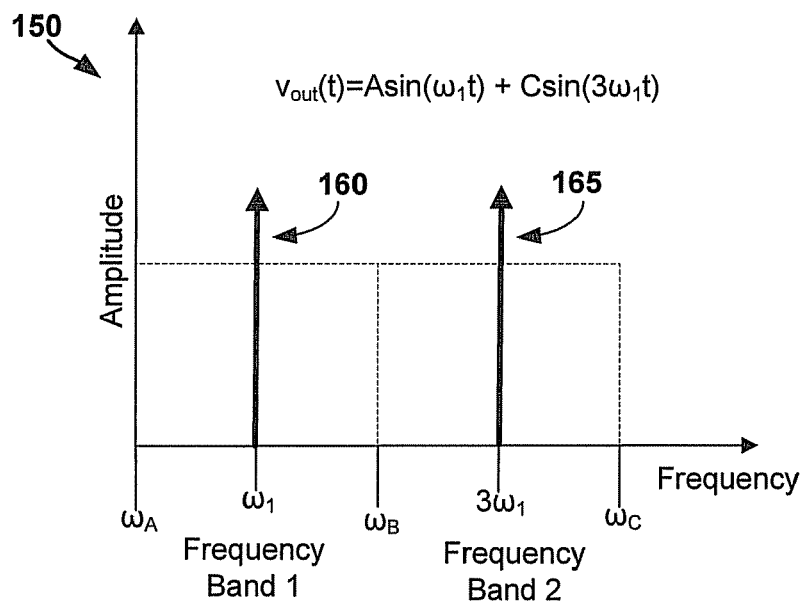
FIG. 1D is another example graph of an analog electrical signal.

FIG. 1D is an example graph 150 of an analog output signal of nonlinear amplifier 135 shown in FIG. 1C. The graph 150 in FIG. 1D shows $v_{in}(t)=A\sin(\omega_1 t)+C\sin(3\omega_1 t)$, in the frequency domain. That is, the signal has two components, an impulse at frequency $\omega_1$ 160 within Frequency Band 1 that represents a first harmonic component and another impulse at frequency $3\omega_1$ 165 in Frequency Band 2 that represents third harmonic distortion. Thus, in certain RF applications, the third harmonic distortion at frequency $3\omega_1$ 165 in Frequency Band 2 may interfere with signals used by other system users within the frequency band. Therefore, it would be beneficial to reduce the third harmonic distortion in RF applications.

Figure 2A:
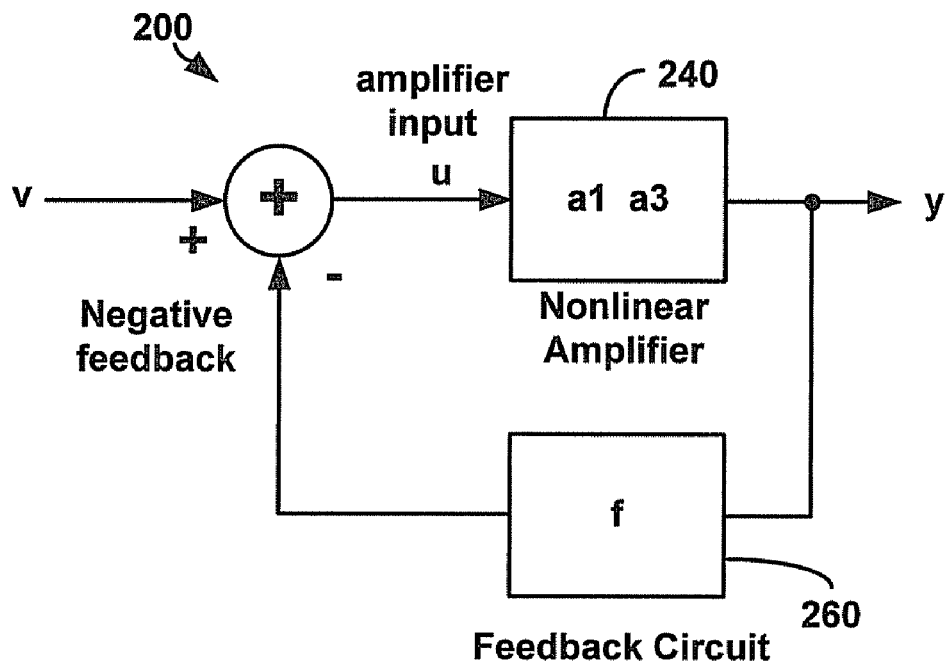
FIGS. 2A and 2B are block diagrams of example circuits each including a nonlinear differential amplifier with a linear feedback circuit.
Figure 2B:
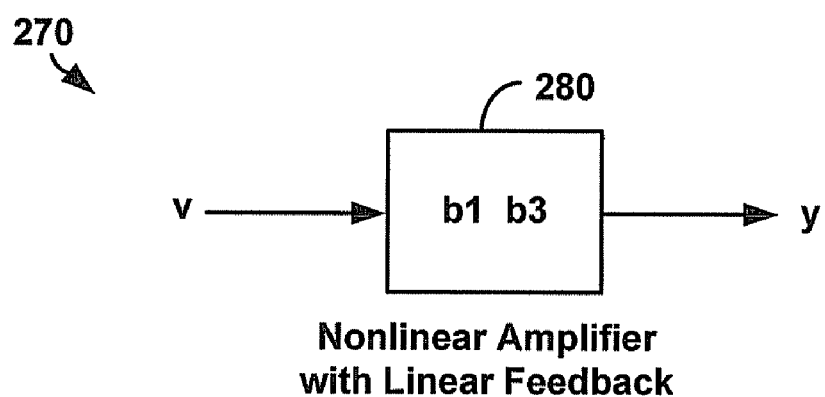
Figure 2C:
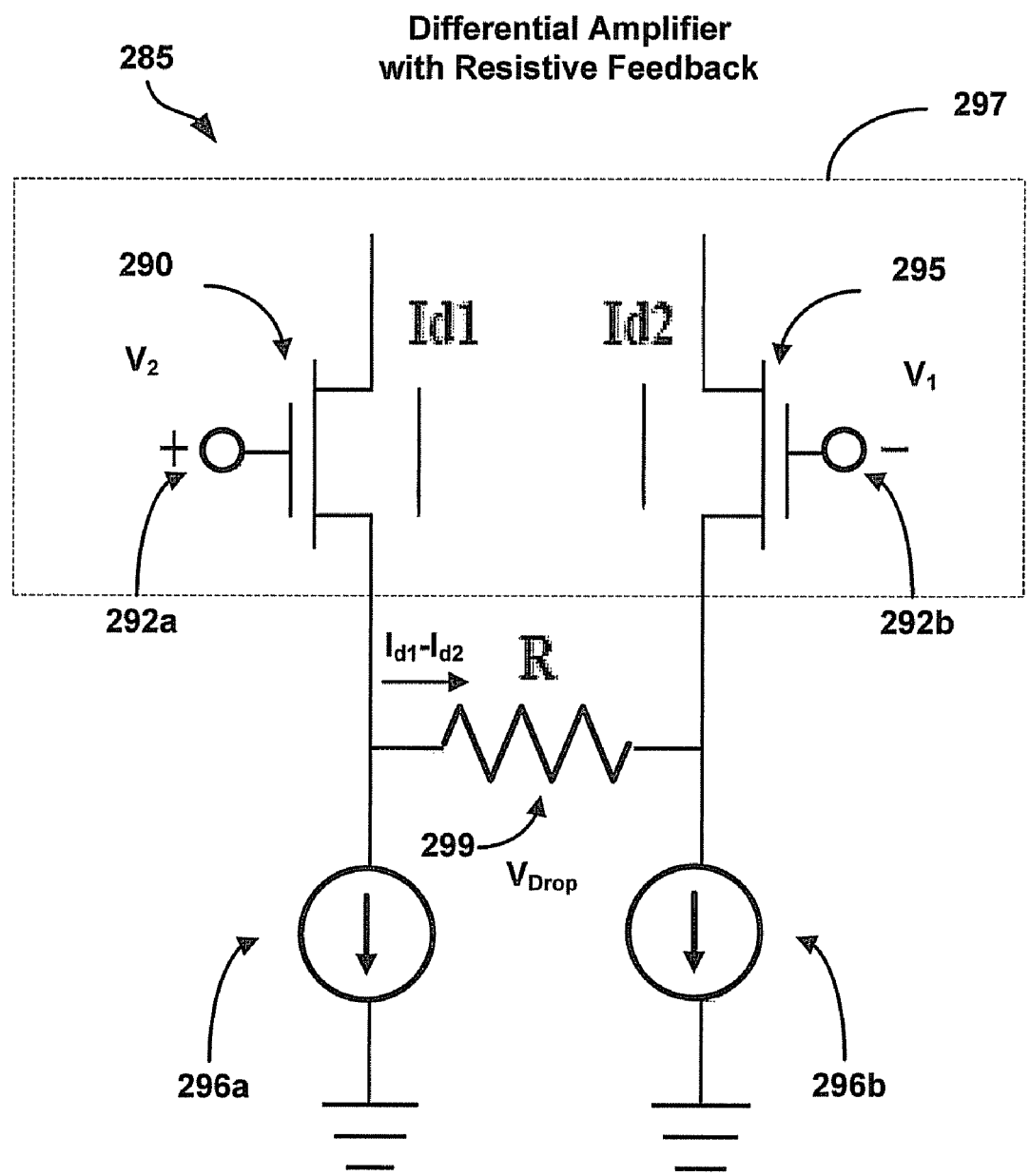
FIG. 2C is a schematic diagram of an example circuit including a nonlinear differential amplifier with a linear feedback circuit that reduces third harmonic distortion produced by the nonlinear differential amplifier.

The following detailed description for FIGS. 2A-2C discloses embodiments that reduce third harmonic distortion produced by a nonlinear amplifier by using a linear feedback circuit. The description includes a mathematical analysis that yields a factor by which third harmonic distortion may be decreased.

FIG. 2A is a block diagram of an example circuit 200 that includes a nonlinear differential amplifier circuit 240 with a linear feedback circuit 260. Further, the nonlinear differential amplifier circuit 240 receives an amplifier input (u).

Mathematical analysis of circuit 200 shows that an output analog signal (y) of the amplifier 240 can be expressed in terms of an amplifier input (u) using Taylor series expansion of the amplifier transfer characteristic (e.g., $$\frac{v_{out}}{v_{in}},$$

y/u, etc.). Further, In addition, the nonlinear differential amplifier circuit 240 suppresses even-order harmonics. Thus, the Taylor series expansion of the output signal (y) for the nonlinear differential amplifier 240 contains a first harmonic and a third harmonic distortion as shown in the following expression:

$$y = a_1 u + a_3 u^3 \qquad (4)$$

If an analog signal with operating frequency ω is the amplifier input signal (u), then the coefficients $a_1$, and $a_3$ can be considered the amplitude gains provided by the nonlinear differential amplifier 240 to the first and third harmonics of the amplifier input signal (u).

Because the linear feedback circuit 260 is in negative feedback with the nonlinear differential amplifier circuit 240, the circuit input signal (v) can be written in terms of the output signal (y), the linear feedback factor (f), and the amplifier input signal (u) by the following expression:

$$v = u = fy \qquad (5)$$

Substituting (y) from Equation (4) yields:

$$v = u + (a_1 u + a_3 u^3) f \qquad (6)$$

Expanding Equation (6) and simplifying the resulting expression yields:

$$v = (1 + a_1 f) u + a_3 f u^3 \qquad (7)$$

Referring to FIG. 2B, a conceptual block diagram is shown for an example circuit 270 including a nonlinear differential amplifier with linear feedback circuit 280. The example circuit 270 is an equivalent structure to example circuit 200 in FIG. 2A. Analyzing circuit 270 combined with the analysis of circuit 200 in FIG. 2A yields a factor that reduces third harmonic distortion.

The nonlinear differential amplifier with linear feedback 280 receives an input signal (v) and delivers an output signal (y). The small output analog signal (y) of the nonlinear differential amplifier circuit with linear feedback 280 can be expressed in terms of the small analog input signal (v) using Taylor series expansion of the transfer characteristic resulting in the following expression:

$$y = b_1 v + b_3 v^3 \qquad (8)$$

Substituting for output signal (y) and input signal (v) from Equations (4) and (8), results in the following expression:

$$a_1 u + a_3 u^3 = b_1 \{(1 + a_1 f) u + a_3 f u^3\} + b_3 \{(1 + a_1 f) u + a_3 f u^3\}^3 \qquad (9)$$

Next, equating coefficients of u and mathematical manipulating the resulting expression yields the following transfer characteristics for a first harmonic of the nonlinear differential amplifier circuit with linear feedback (240, 260, 280) shown in FIGS. 2A and 2B:

$$b_1 = \frac{a_1}{(1 + a_1 f)} \qquad (10)$$

Thus, Equation (10) mathematically shows that the nonlinear differential amplifier circuit (240, 280) provides a gain $a_1$ to a first harmonic input signal (v) and also reduces the first harmonic component by a factor of $(1+a_1 f)$ when linear feedback is applied.

Further, equating the coefficients for $u^3$ in Equation (9), then substituting $b_1$ from Equation (10) as well as simplifying the resulting expression yields:

$$b_3 = \frac{a_3}{(1 + a_1 f)^3} \qquad (11)$$

Thus, Equation (11) shows that the third order transfer characteristic of the nonlinear differential amplifier 280 reduces the third harmonic distortion by a factor of $(1+a_1 f)^3$ when implementing linear feedback.

FIG. 2C is a schematic diagram of an example circuit 285 including a nonlinear differential amplifier 297 with a linear feedback circuit 299. Generally, the linear feedback circuit 299 reduces the third harmonic distortion created by amplifier 297. Specifically, the circuit 285 includes a first transistor 290 and a second transistor 295 that comprise the nonlinear differential amplifier 297. Further, the linear feedback circuit 299 comprises a resistor, R, that is placed in negative feedback with the nonlinear differential amplifier 297.

The circuit input signal (v) is the difference between a voltage $V_2$ applied to a positive node 292a and a voltage $V_1$ applied to a negative node 292b of the nonlinear differential amplifier 297 ($V_2-V_1$). The positive node 292a is the gate voltage ($V_G$) of the first transistor 290 and the negative node 292b is the $V_G$ of the second transistor 295. Drain currents $I_{d1}$ and $I_{d2}$ flow through the first transistor 290 and second transistor 295, respectively, when voltages $V_2$ and $V_1$ applied to the nonlinear amplifier 297 to turn on each transistor (290, 295).

The nonlinear differential amplifier 297 is a transconductance circuit such that given an input voltage ($V_2-V_1$), the nonlinear differential amplifier 297 provides an output current $$\left(g_m = \frac{i_{out}}{v_{in}}\right).$$

When a first transistor 290 and a second transistor 295 are both biased by such $V_2=V_1$, then $I_{d1}=I_{d2}$. However, if $V_2$ is slightly greater than $V_1$ then the drain current of the first transistor 290 slightly increases ($I_{d1}+\delta$) and the drain current for the second transistor 295 slightly decreases ($I_{d1}-\delta$). Further, the first transistor 290 is connected to a first constant current source 296a and the second transistor 295 is connected to a second constant current source 296b. Thus, a current $I_{d1}-I_{d2}=\delta$ flows across the resistor, R, to maintain the constant current sources (296a, 296b).

Consequently, $I_{d1}-I_{d2}$ may be considered the output current signal of the nonlinear differential amplifier 297. Although nonlinear differential amplifier 297 delivers an output current signal, $I_{d1}-I_{d2}$, an output signal (y) of the circuit 285 can also be the voltage, $V_{Drop}$, across resistor, R, in the linear feedback circuit 299. Further, the amplifier output current, $I_{d1}-I_{d2}$, and thereby, $V_{Drop}$, may include a third harmonic distortion component due to the nonlinear effects of the amplifier 297. However, the linear feedback circuit 299 may reduce the third harmonic distortion which can be shown in the following mathematical analysis of circuit 285.

The output current of nonlinear differential amplifier 297, $I_{d1}-I_{d2}$ can be expressed using Taylor series expansion, given a small analog input signal $V_2-V_1=P \sin(\omega_1 t)$ yielding $I_{d1}-I_{d2}=a_1 \sin(\omega_1 t)+a_3 \sin(3\omega_1 t)$, where coefficients $a_1$ and $a_3$ are proportional to transconductance, $g_m$, of amplifier 297. Mathematical analysis yields the first harmonic of the output signal (y) to be:

$$a_1 = \frac{Bg_m P}{1+g_m R} \tag{12}$$

In Equation (12), the transconductance, $g_m$, is proportional to first order coefficient $a_1$ and R is proportional to the linear feedback factor (f) in Equation (10), respectively, with B being a proportionality constant.

Further mathematical analysis reveals that the third harmonic distortion component of output signal (y) can be expressed as:

$$a_3 = \frac{Cg_m P^3}{(1+g_m R)^3} \tag{13}$$

Where C is a proportionality constant. Thus, Equation (13) shows that the linear feedback circuit 299 reduces the third harmonic distortion component by a factor of $(1+g_m R)^3$.

Figure 3A:
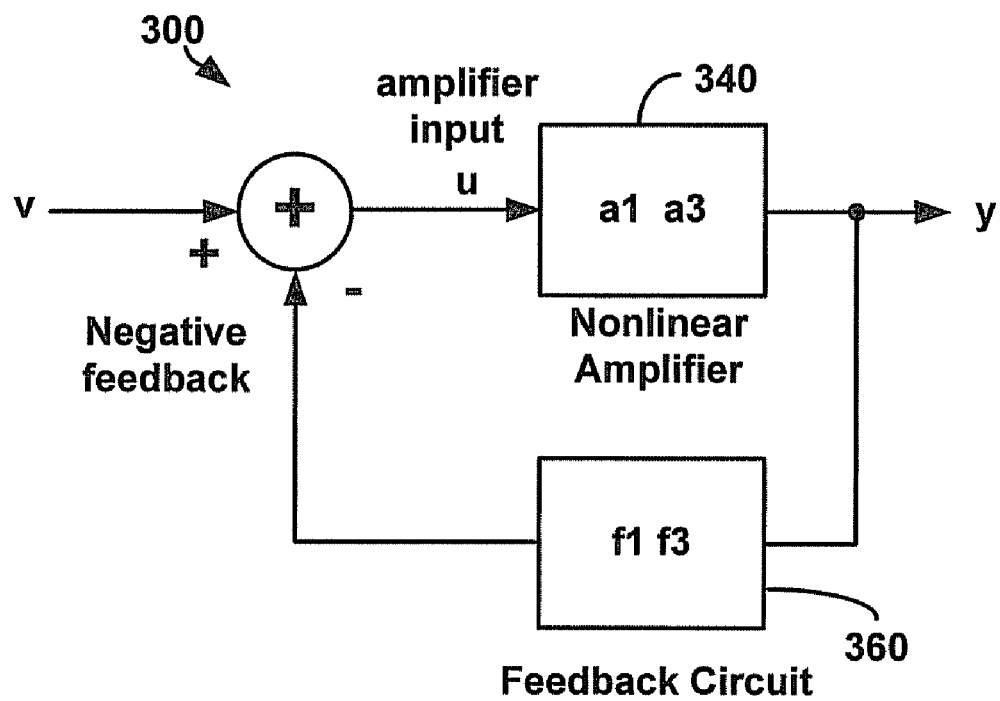
FIGS. 3A and 3B are block diagrams of example circuits each including a nonlinear differential amplifier with a nonlinear feedback circuit.
Figure 3B:
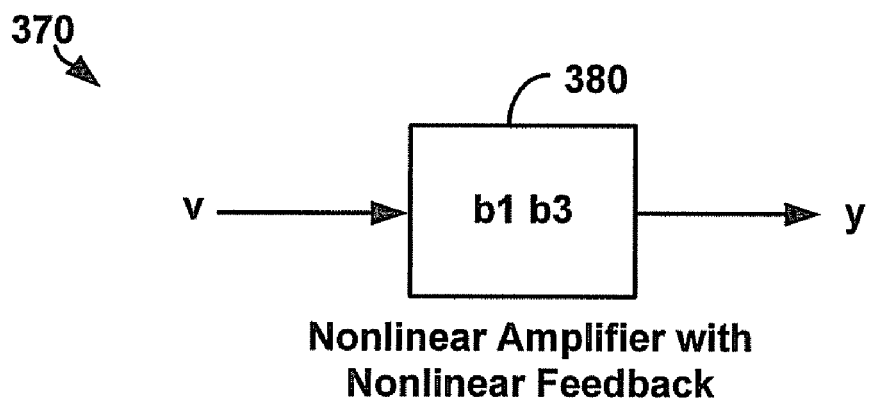
Figure 4:
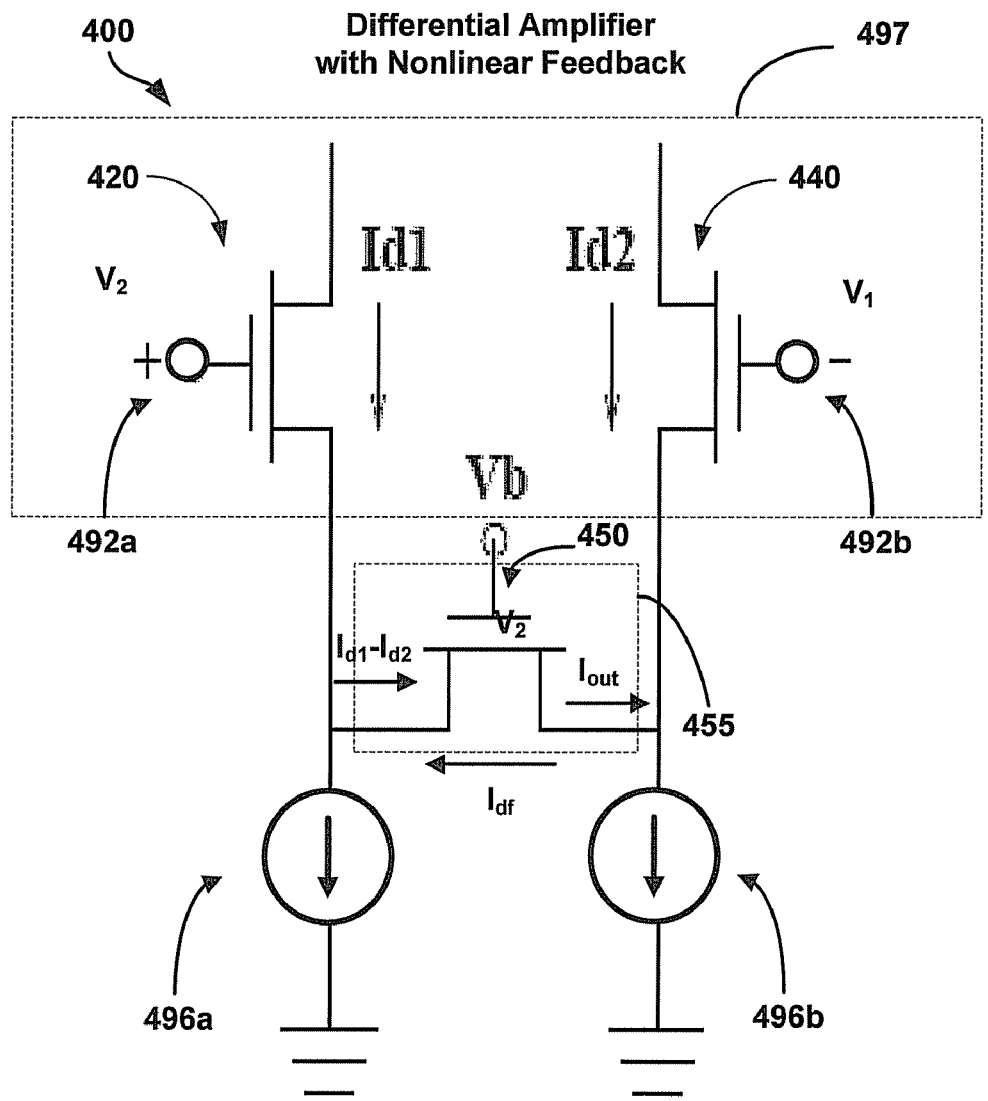
FIGS. 4-5 are schematic diagrams of example circuits including a nonlinear differential amplifier with a nonlinear feedback circuit that reduces third harmonic distortion produced by the nonlinear differential amplifier.
Figure 5:
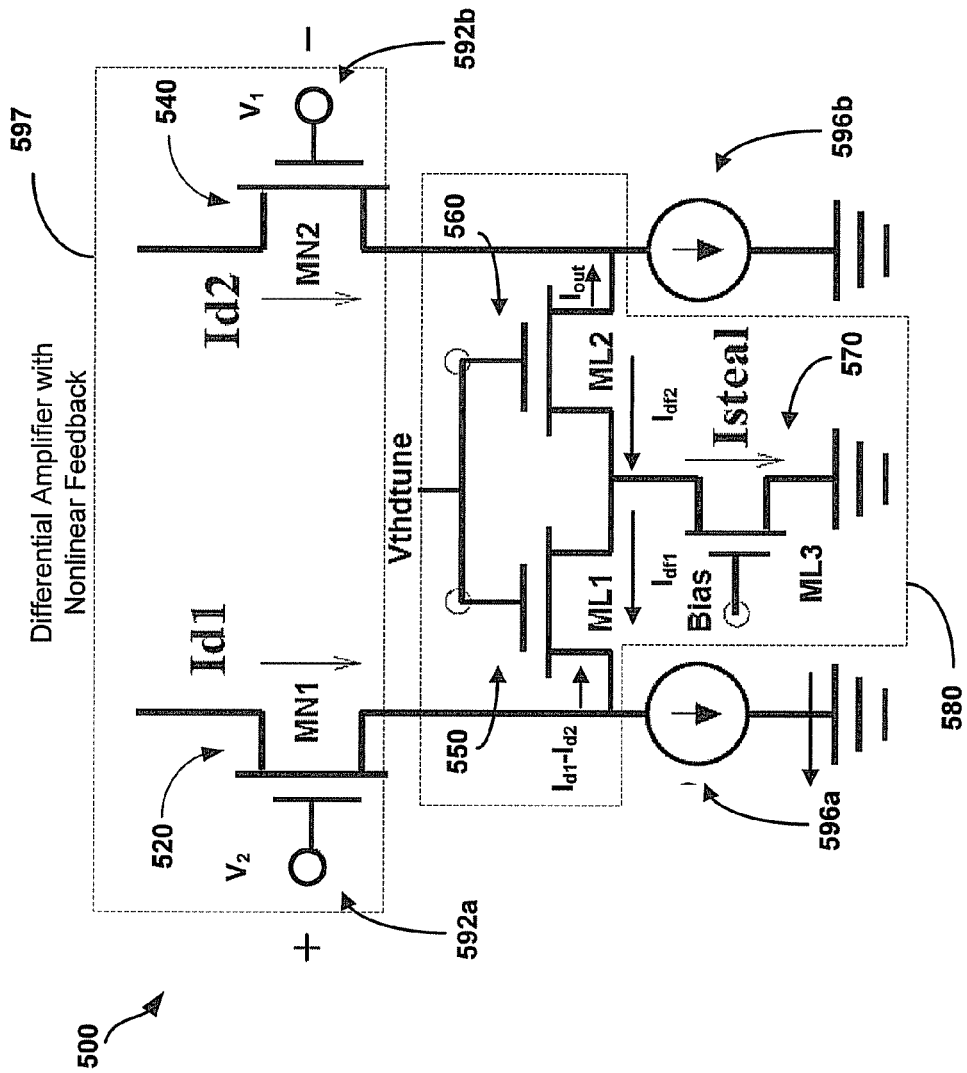

The following detailed description for FIGS. 3-5 disclose embodiments that reduce third harmonic distortion and also are capable of cancelling such distortion created by a nonlinear amplifier, for example. Mathematical analysis of the following example circuits includes conditions for reducing as well as potentially canceling third harmonic distortion.

FIG. 3A is another block diagram of an example circuit 300 that includes a nonlinear differential amplifier 340 with a nonlinear feedback circuit 360. The circuit 300 receives an input signal (v) and delivers an output signal (y). Further, the nonlinear differential amplifier circuit 340 receives an amplifier input signal (u).

Analyzing circuit 300 reveals the output signal (y) can be expressed as a Taylor series approximation with respect to a small amplifier input signal (u):

$$y = a_1 u + a_3 u^3 \tag{14}$$

Further mathematical analysis of circuit 300 yields an expression for circuit input signal (v) as the following:

$$v = u+(a_1 u+a_3 u^3)f_1+(a_1 u+a_3 u^3)^3 f \tag{15}$$

where $f_1$ and $f_3$ are factors of the nonlinear feedback circuit.

Referring to FIG. 3B, a block diagram is shown of an example circuit 370 including a nonlinear differential amplifier circuit with nonlinear feedback 380. The example circuit 370 is similar in structure to example circuit 300 in FIG. 3A. Analyzing circuit 370 in this manner, combined with the mathematical analysis of circuit 300 in FIG. 3A yields a factor that not only reduces but may also cancel third harmonic distortion.

The nonlinear differential amplifier circuit with nonlinear feedback circuit 380 receives an input signal (v) and delivers and output signal (y). The output analog signal (y) of the nonlinear differential amplifier 380 can be expressed in terms of an small analog amplifier input signal (v) using Taylor series expansion of the transfer characteristic of the nonlinear differential amplifier with nonlinear feedback 380 yielding:

$$y = b_1 v + b_3 v^3 \tag{16}$$

Substituting for output signal (y) and input signal (v) from Equations (14) and (15), results in the following expression:

$$a_1 u + a_3 u^3 = b_1 \{u+(a_1 u+a_3 u^3)f_1+(a_1 u+a_3 u^3)f_3\}+b_3\{u+(a_1 u+a_3 u^3)f_1+(a_1 u+a_3 u^3)f_3\} \tag{17}$$

Equating coefficients of u and applying mathematical manipulation results in the following coefficient of the transfer characteristic for a first harmonic of the nonlinear differential amplifier 380:

$$b_1 = \frac{a_1}{(1+a_1 f_1)} \tag{18}$$

Equation (18) mathematically shows that a gain $a_1$ the first order harmonic provided by the nonlinear amplifier (340, 380) is reduced by a factor of $(1+a_1 f_1)$ when nonlinear feedback (360, 380) is applied.

Further, equating the coefficients for $u^3$ from Equation (17), substituting $b_1$ from Equation (18), and then mathematically simplifying the resulting expression yields:

$$b_3 = \frac{a_3-a_1^4 f_3}{(1+a_1 f_1)^3} \tag{19}$$

Equation (19) shows that the third order transfer characteristics are reduced by a factor of $(1+a_1 f_1)^3$ when implementing nonlinear feedback circuit (360, 380) with a nonlinear amplifier (340, 380). Moreover, third order harmonic distortion can be cancelled as shown when letting $b_3=0$ yielding:

$$f_3 = \frac{a_3}{a_1^4} \tag{20}$$

Thus, if the nonlinear feedback circuit 360 in FIG. 3A produces a third harmonic factor $f_3$ with a value as shown in Equation (20), then the third harmonic distortion created by the amplifier can be cancelled, for example.

FIG. 4 is a schematic diagram 400 of an example circuit 400 that includes a nonlinear differential amplifier circuit 497 with a nonlinear feedback circuit 455. Generally, circuit 400 can reduce or cancel third harmonic distortion created by nonlinear amplifier 497 using nonlinear feedback circuit 455. Specifically, the nonlinear differential amplifier circuit 497 includes a first transistor 420 and a second transistor 440. The feedback circuit 455 further includes a feedback transistor 450 that may be biased in a linear or triode mode and is connected in negative feedback with the nonlinear differential amplifier 497.

An input signal (v) to the circuit 400 can the difference between a voltage $V_2$ applied to a positive node 492a and a voltage $V_1$ applied to a negative node 492b of the nonlinear differential amplifier 497. The voltage $V_1$ and $V_2$ are the gatevoltages ($V_G$) of the first transistor 420 and second transistor 440, respectively. Further, biasing the first and second transistors (420, 440) in this manner provides drain currents $I_{d1}$ and $I_{d2}$ for the first and second transistors (420, 440), respectively.

As discussed in describing behavior of nonlinear differential amplifier 297 in circuit 285 in FIG. 2C, a current $I_{d1}-I_{d2}$ may flow across the feedback transistor 450 to maintain constant current sources (496a, 496b) when $V_2 \neq V_1$. The current $I_{d1}-I_{d2}$ may be an output signal of the nonlinear differential amplifier 497. Given small analog input $V_2-V_1=P \sin(\omega_1 t)$ and expanding the amplifier output signal, $I_{d1}-I_{d2}$, using Taylor series expansion may result in a signal $I_{d1}-I_{d2}=a_1 \sin(\omega_1 t)+$ $a_3 \sin(3\omega_1 t)$ containing a first harmonic component and a third harmonic distortion component created due to the nonlinearity of the amplifier 497.

However, the nonlinear feedback circuit 455 can produce a current signal, $I_{df}$, that includes a third harmonic component that may reduce or cancel the third harmonic distortion created by the nonlinear differential amplifier 497. Consequently, a voltage bias, $V_b$, may be applied to the feedback transistor 450 allowing the drain current, $I_{df}$, to flow through the feedback transistor 450. Biasing the feedback transistor 450 in this manner allows the feedback transistor 450 to produce a drain current containing a first and third harmonic components such that $I_{df}=f_1 \sin(\omega_1 t)+f_3 \sin(3\omega_1 t)$. By coupling the feedback transistor 450 in negative feedback with the nonlinear differential amplifier 497, the output current, $(I_{d1}-I_{d2})$, created by the nonlinear differential amplifier 497 combines negatively with the drain current, $I_{df}$, produced by the feedback transistor 450 resulting in an output current, $I_{out}=(I_{d1}-I_{d2})-I_{df}$, for the circuit 400. Therefore, the third harmonic distortion created by the nonlinear differential amplifier can be reduced or cancelled by the third harmonic component produced by the feedback transistor 450 by controlling the voltage bias, $V_b$.

The drain current, $I_{df}$, for the feedback transistor 450 is given by the following ideal drain current equation for a MOS transistor operating in a linear mode:

$$I_D = \mu_n C_{ox} \frac{W}{L}\left[(V_{GS}-V_t)V_{DS} - \frac{1}{2}V_{DS}^2\right] \quad (21)$$

where $V_{GS}$ is the gate-source voltage, $V_t$ is the threshold voltage, $V_{DS}$ is the drain-source voltage, $\mu_n$ is the charge-carrier effective mobility, W is the gate width, L is the gate length and $C_{ox}$ is the gate oxide capacitance per unit area of the MOS transistor. The third harmonic component of the current can be explained when considering short-channel effects of a transistor, namely, velocity saturation due to the horizontal field and mobility degradation due to the vertical field. Thus, the drain current for the feedback transistor 450 considering the short channel effects can be written as:

$$I_D = \frac{\mu_{eff} C_{ox}}{\left(1+\frac{V_{DS}}{\xi_c L}\right)} \frac{W}{L}\left[(V_{GS}-V_t)V_{DS} - \frac{1}{2}V_{DS}^2\right] \quad (22)$$

Where:

$$\mu_{eff} = \frac{\mu_n}{1+\theta(V_{GS}-V_t)} \quad (23)$$

In the above equations, $\epsilon_c$ denotes the critical horizontal field and $\theta$ captures the mobility degradation due to vertical field of the MOS transistor in feedback. Expanding Equation (22) using Taylor series expansion and simplifying accordingly may result in $I_{df}=f_1 \sin(\omega_1 t)+f_3 \sin(3\omega_1 t)$ such that there is a first harmonic component and a third harmonic component, where $f_1$ and $f_3$ are feedback factors of nonlinear feedback circuit 455.

The voltage bias, $V_b$, in FIG. 4 can be calculated such that the feedback transistor 450 can produce a feedback third harmonic component to reduce or cancel the third harmonic distortion component of the nonlinear differential amplifier 497.

Conversely, FIG. 5 is another schematic diagram of an example circuit 500 including a nonlinear differential amplifier 597 with a nonlinear feedback circuit 580. Generally, circuit 500 reduces or cancels the third harmonic distortion component of the nonlinear differential amplifier 597. Specifically, the nonlinear differential amplifier 597 includes a first transistor 520, MN1, and a second transistor 540, MN2. Further, the circuit 500 shows a nonlinear feedback circuit 580 coupled in negative feedback with the nonlinear differential amplifier 597. The nonlinear feedback circuit 580 includes a first feedback transistor 550 ML1, a second feedback transistor 560 ML2, and a third feedback transistor 570 ML3.

An input signal (v) to the circuit 500 can be the difference between a voltage $V_2$ applied to a positive node 592a and a voltage $V_1$ applied to a negative node 592b of the nonlinear differential amplifier 597. The voltage $V_1$ and $V_2$ are the gatevoltages ($V_G$) of the first transistor 520 MN1 and second transistor 540 MN2, respectively. Biasing the first and second transistors (520, 540) in this manner provides drain currents $I_{d1}$ and $I_{d2}$ flowing through the first and second transistors (520, 540), respectively. However, if $V_2 \neq V_1$, then a current $I_{d1}-I_{d2}$ may flow across the nonlinear feedback circuit 580 to maintain the constant current sources (596a, 596b). Thus, the signal $I_{d1}-I_{d2}$ may be the output signal of amplifier 597. Further analysis of circuit 500 with small analog signal input $(V_2-V_1)$ may yield a Taylor series expansion of amplifier output signal $I_{d1}-I_{d2}=a_1 \sin(\omega_1 t)+a_3 \sin(3\omega_1 t)$. As a result, the amplifier output signal $I_{d1}-I_{d2}$ contains a first harmonic component and a third harmonic distortion component.

However, the nonlinear feedback circuit 580 can produce current signals, $I_{df1}$ and $I_{df2}$, that include third harmonic components that may reduce or cancel third harmonic distortion created by the nonlinear differential amplifier 597. Consequently, a voltage bias, $V_{thdtune}$, may be applied to the both first feedback transistor 550 ML1 and the second feedback transistor 560 ML2 allowing drain currents, $I_{df1}$ and $I_{df2}$ to flow through the first and second feedback transistors (540, 550), respectively. Further, a voltage bias may be applied to the third feedback transistor 570 allowing a drain current, $I_{steal}$ to flow through the third feedback transistor 570. Biasing the three feedback transistors (540, 550, 570) in this manner allows the feedback transistors (540, 550, 570) to produce a drain current for the first and second feedback transistor that may contain a first and third harmonic components such that $I_{df1}=f_{11} \sin(\omega_1 t)+f_{13} \sin(3\omega_1 t)$ and $I_{df2}=f_{21} \sin(\omega_1 t)+f_{23} \sin(3\omega_1 t)$, for example. By coupling the feedback circuit 580 in negative feedback with the nonlinear differential amplifier 597, the current created by the nonlinear differential amplifier 597 combines with the current produced by the nonlinear feedback circuit 580, $I_{df1}$ and $I_{df2}$, resulting in an output current, $I_{out}=(I_{d1}-I_{d2})-(I_{df1}-I_{df2})$, for the circuit 500. Therefore, the third harmonic distortion component created by the nonlinear differential amplifier can be reduced or cancelled by the third harmonic component produced by the nonlinear feedback circuit 580 by controlling bias voltages of the feedback transistors (550, 560, 570).

To simulate the circuit, a simulation limitation of $V_{DS} \neq 0$ imposed by inaccurate transistor modeling can be overcome by modeling the feedback transistor 450 of the nonlinear feedback circuit 455 in FIG. 4 as two transistors connected in series ML1 and ML2 (550, 560) and stealing away a small current $I_{steal}$ from an intermediate node using transistor ML3 (570) as shown in FIG. 5. Using this model, both the feedback transistors ML1 and ML2 (550, 560) develop a small $V_{DS}$ drop to sustain a current $$\frac{I_{steal}}{2}$$

and the point $V_{DS}=0$ can be avoided. The current $I_{steal}$ can be realized by third feedback transistor 570 biased in a triode region. Further, a simulation model can be used to calculate the bias voltages for the transistors ML1, ML2, and ML3 (550, 560, 570) in the nonlinear feedback circuit to reduce or cancel third harmonic distortion in the circuit.

Figure 6A:
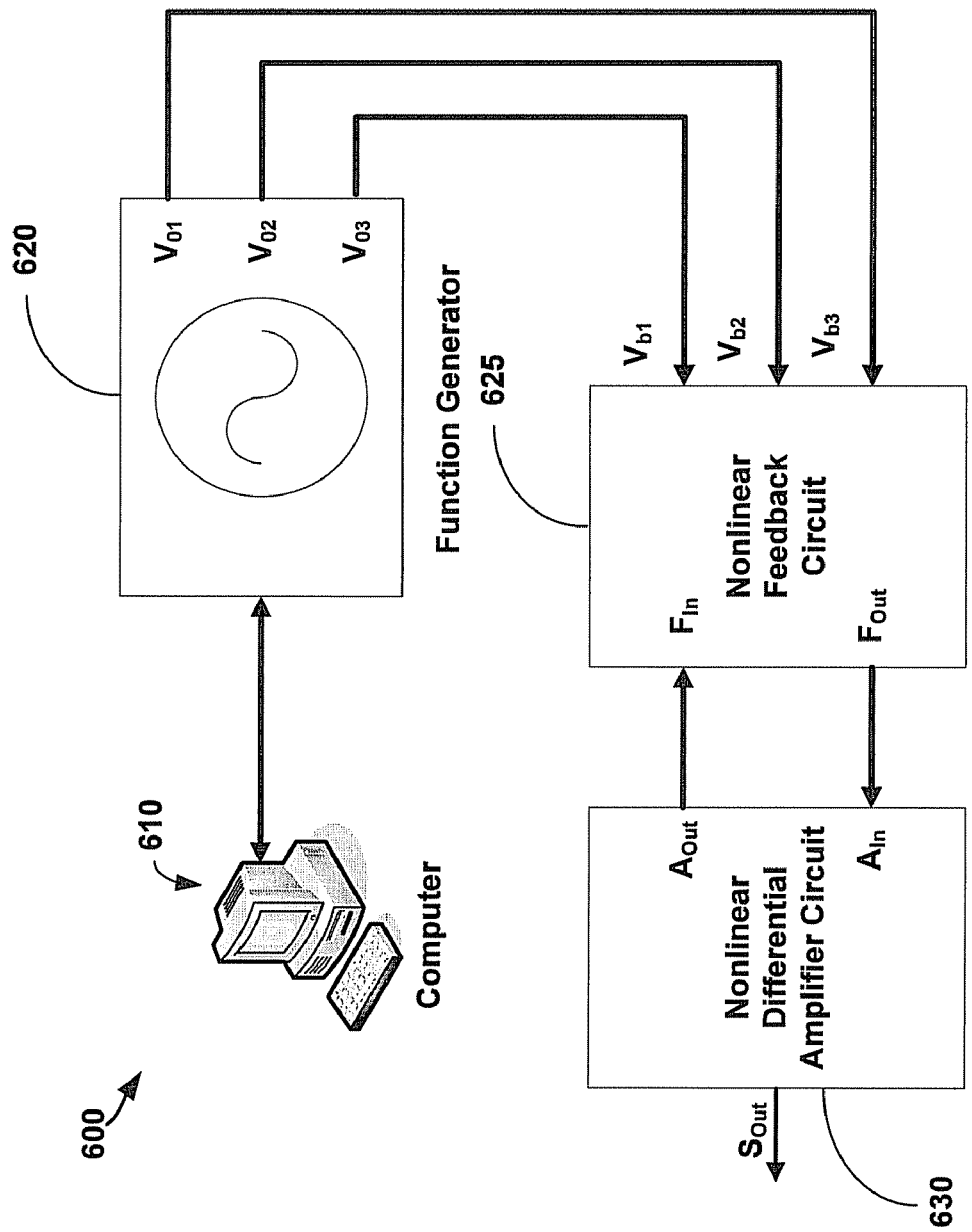
FIG. 6A is an example system for reducing third harmonic distortion in a nonlinear differential amplifier circuit with a nonlinear feedback circuit.

FIG. 6A is an example system 600 for reducing or canceling third harmonic distortion in a nonlinear differential amplifier circuit 630 with a nonlinear feedback circuit 625. The system 600 includes a computer 610 that may be connected to a function generator 620. Further, the function generator 620 may be connected to a nonlinear feedback circuit 625. In addition, the nonlinear feedback circuit 625 may be coupled to the nonlinear differential amplifier circuit 630 in a negative feedback configuration such that an output node ($A_{out}$) of the amplifier circuit 630 may be connected to an input node ($F_{in}$) of the nonlinear feedback circuit 625 and an output node ($F_{out}$) of the nonlinear feedback circuit 625 may be connected to an input node ($A_{in}$) of the amplifier circuit 630.

The system 600 reduces or cancels third harmonic distortion produced by the nonlinear differential amplifier circuit 630 using the nonlinear feedback circuit 625, computer 610, and function generator 620. The nonlinear differential amplifier circuit 630 may produce an output current signal ($A_{out}$) that includes a first harmonic component and third harmonic distortion. The nonlinear amplifier circuit 625 may be configured as in example circuits (400, 500) in FIGS. 4 and 5 such that the feedback circuit 625 may include one or more feedback transistors. Further, each feedback transistor may have an input node where a bias voltage may be applied to control a current signal produced by a feedback transistor. Nonlinear feedback circuit 625 includes three input nodes $V_{b1}$, $V_{b2}$, and $V_{b3}$, for three different feedback transistors in nonlinear feedback circuit 625. Each current signal produced by a feedback transistor may contain a first and a third harmonic component. The output current signal, $F_{out}$, of the nonlinear feedback circuit is the combination of current signals produced by each feedback transistor, and therefore includes a third harmonic component that is a combination of the third harmonic component of each current signal produced by a feedback transistor. Because the nonlinear feedback circuit 625 is in negative feedback with the nonlinear amplifier circuit 630, third harmonic components of the feedback output signal, $F_{out}$, may reduce or cancel third harmonic distortion produced by the nonlinear amplifier circuit 630. Thus, a system output signal ($S_{out}$) may be delivered that contains less third harmonic distortion than the amplifier output signal.

A computer 610 may be used to calculate the values for bias voltages $V_{b1}$, $V_{b2}$, and $V_{b3}$, needed to create a third harmonic component in the output signal $F_{out}$ of the nonlinear feedback circuit 625 to reduce or cancel third harmonic distortion produced by the amplifier circuit 620. Further, the computer 610 may simulate a model of nonlinear amplifier circuit 630 and nonlinear feedback circuit 625 to calculate values for the bias voltages $V_{b1}$, $V_{b2}$, and $V_{b3}$. The computer 610 may also send control information to a function generator 620 that includes the values for the bias voltages $V_{b1}$, $V_{b2}$, and $V_{b3}$. In addition, the function generator 620 may include a second computing device to receive the control information from computer 610 and control bias voltages $V_{b1}$, $V_{b2}$, and $V_{b3}$. The function generator may then deliver voltage signals from outputs $V_{o1}$, $V_{o2}$, and $V_{o3}$, according to calculations provided by the computer 610, to an input node of each feedback transistor in the nonlinear feedback circuit 625.

Figure 6B:
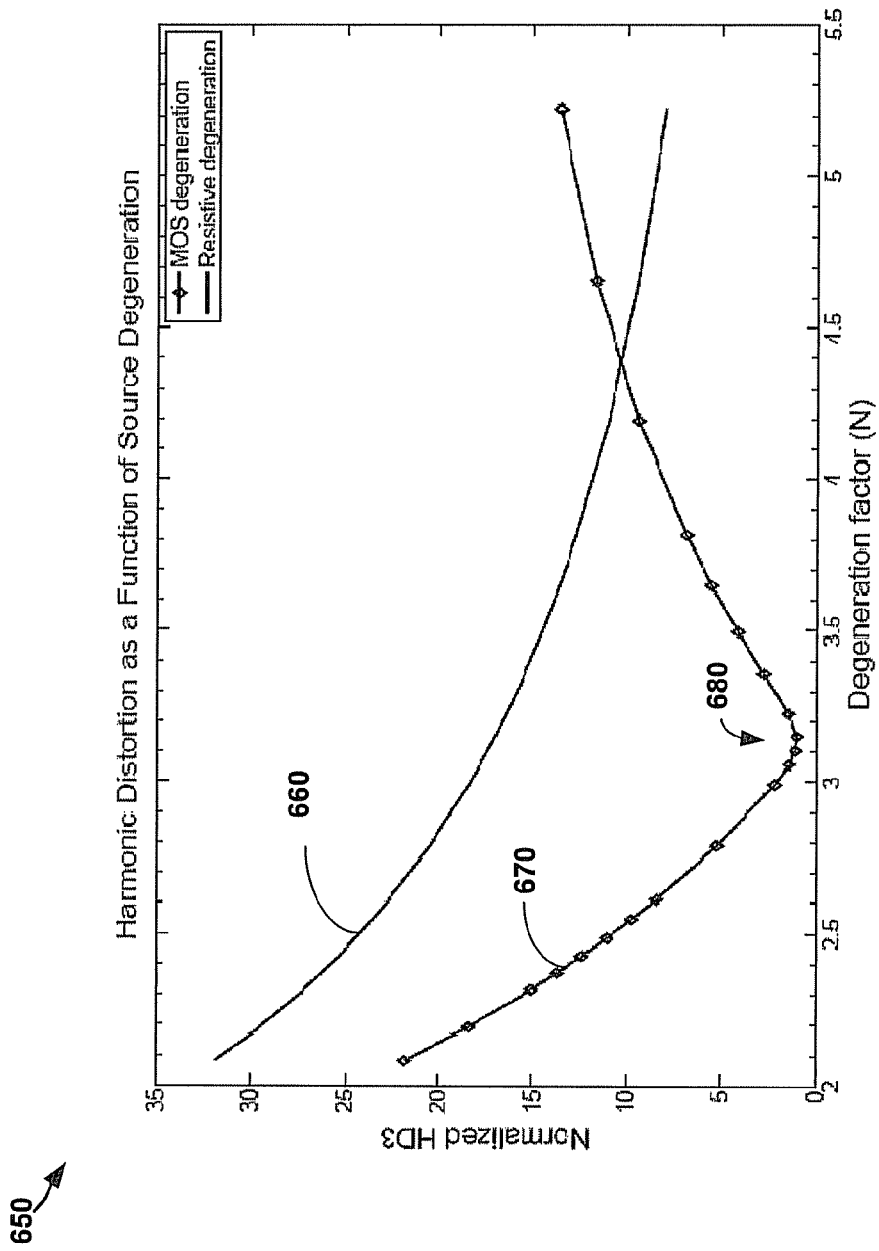
FIG. 6B is an example graph comparing the reduction of a third harmonic distortion of a nonlinear differential amplifier circuit using a linear feedback circuit as opposed to a nonlinear feedback circuit.

FIG. 6B is an example graph 650 comparing a reduction of a third harmonic distortion component of a nonlinear differential amplifier using a linear feedback circuit 660 as opposed to a nonlinear feedback circuit 670. Generally, the graph 650 illustrates exemplary quantitative benefits to a nonlinear differential amplifier using a nonlinear feedback circuit to reduce the amplifier's third harmonic distortion component. Specifically, the graph 650 illustrates a normalized strength of a third harmonic distortion produced by a nonlinear differential amplifier as a function of a resistive (linear) element coupled in feedback with the nonlinear differential amplifier 670. The resistive element reduces the third harmonic distortion according to a factor N that is proportional to $g_m R$. Further, the graph 650 illustrates a normalized strength of the third harmonic distortion produced by a nonlinear differential amplifier as a function of at least one feedback transistor element coupled in feedback with the nonlinear differential amplifier 670. At a minimum point 680, the third harmonic distortion is reduced by almost 15 times or 23 dB using at least one transistor in feedback when compared to using only a resistor in feedback.

Figure 7:
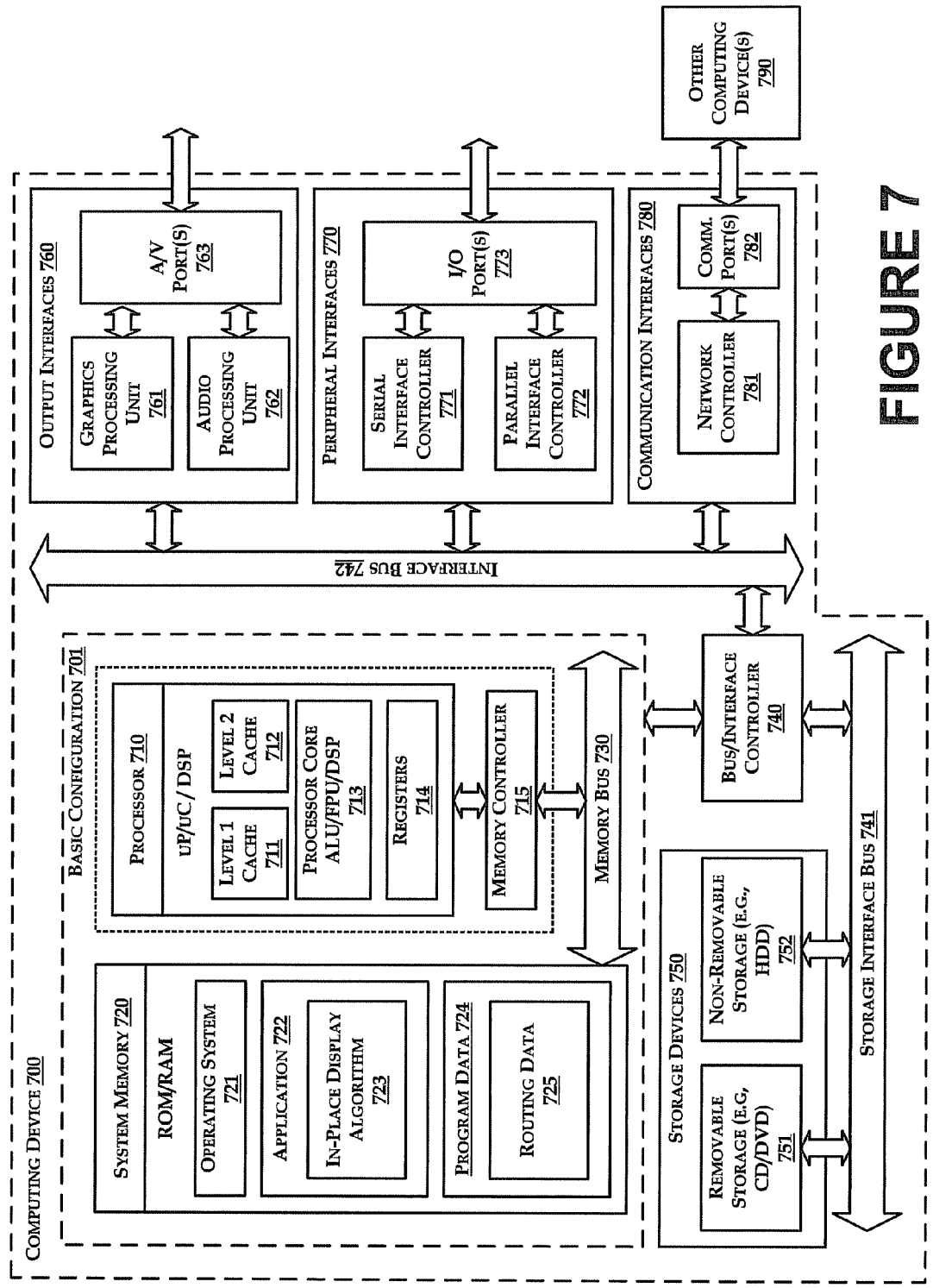
FIG. 7 is an example computing device that is arranged for implementing the method of FIG. 8.

FIG. 7 is a block diagram illustrating an example computing device 700 that is arranged for calculating a bias voltage for one or more transistors in a nonlinear feedback circuit and for controlling the one of more the bias voltages. In a very basic configuration 701, computing device 700 typically includes one or more processors 710 and system memory 720. A memory bus 730 can be used for communicating between the processor 710 and the system memory 720. Depending on the desired configuration, processor 710 can be of any type including but not limited to a microprocessor (µP), a microcontroller (µC), a digital signal processor (DSP), or any combination thereof. Processor 710 can include one more levels of caching, such as a level one cache 711 and a level two cache 712, a processor core 713, and registers 714. The processor core 713 can include an arithmetic logic unit (ALU), a floating point unit (FPU), a digital signal processing core (DSP Core), or any combination thereof. A memory controller 715 can also be used with the processor 710, or in some implementations the memory controller 715 can be an internal part of the processor 710.

Depending on the desired configuration, the system memory 720 can be of any type including but not limited to volatile memory (such as RAM), non-volatile memory (such as ROM, flash memory, etc.) or any combination thereof. The system memory 720 may thus include non-transitory computer-readable media comprising computer-readable media such as short or long term storage. System memory 720 typically includes an operating system 721, one or more applications 722, and program data 724. Application 722 includes control input processing algorithm 723 that is arranged to provide inputs to the electronic circuits, in accordance with the present disclosure. Program Data 724 includes control input data 725 that is useful for minimizing power consumption of the circuits, as will be further described below. In some example embodiments, application 722 can be arranged to operate with program data 724 on an operating system 721 such that power consumption by an electronic circuit is minimized. This described basic configuration is illustrated in FIG. 7 by those components within dashed line 701.

Computing device 700 can have additional features or functionality, and additional interfaces to facilitate communications between the basic configuration 701 and any required devices and interfaces. For example, a bus/interface controller 740 can be used to facilitate communications between the basic configuration 701 and one or more data storage devices 750 via a storage interface bus 741. The data storage devices 750 can be removable storage devices 751, non-removable storage devices 752, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Exemplary computer storage media can include volatile and nonvolatile, removable and non-removable media implemented in any method or technology for storage of information, such as computer readable instructions, data structures, program modules, or other data.

System memory 720, removable storage 751 and non-removable storage 752 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer storage media can be part of device 700.

Computing device 700 can also include an interface bus 742 for facilitating communication from various interface devices (e.g., output interfaces, peripheral interfaces, and communication interfaces) to the basic configuration 701 via the bus/interface controller 740. Exemplary output interfaces 760 include a graphics processing unit 761 and an audio processing unit 762, which can be configured to communicate to various external devices such as a display or speakers via one or more A/V ports 763. Exemplary peripheral interfaces 760 include a serial interface controller 771 or a parallel interface controller 772, which can be configured to communicate with external devices such as input devices (e.g., keyboard, mouse, pen, voice input device, touch input device, etc.) or other peripheral devices (e.g., printer, scanner, etc.) via one or more I/O ports 773. An exemplary communication interface 780 includes a network controller 781, which can be arranged to facilitate communications with one or more other computing devices 790 over a network communication via one or more communication ports 782. The Communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 700 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 can also be implemented as a personal computer including both laptop computer and non-laptop computer configurations.

Figure 8:
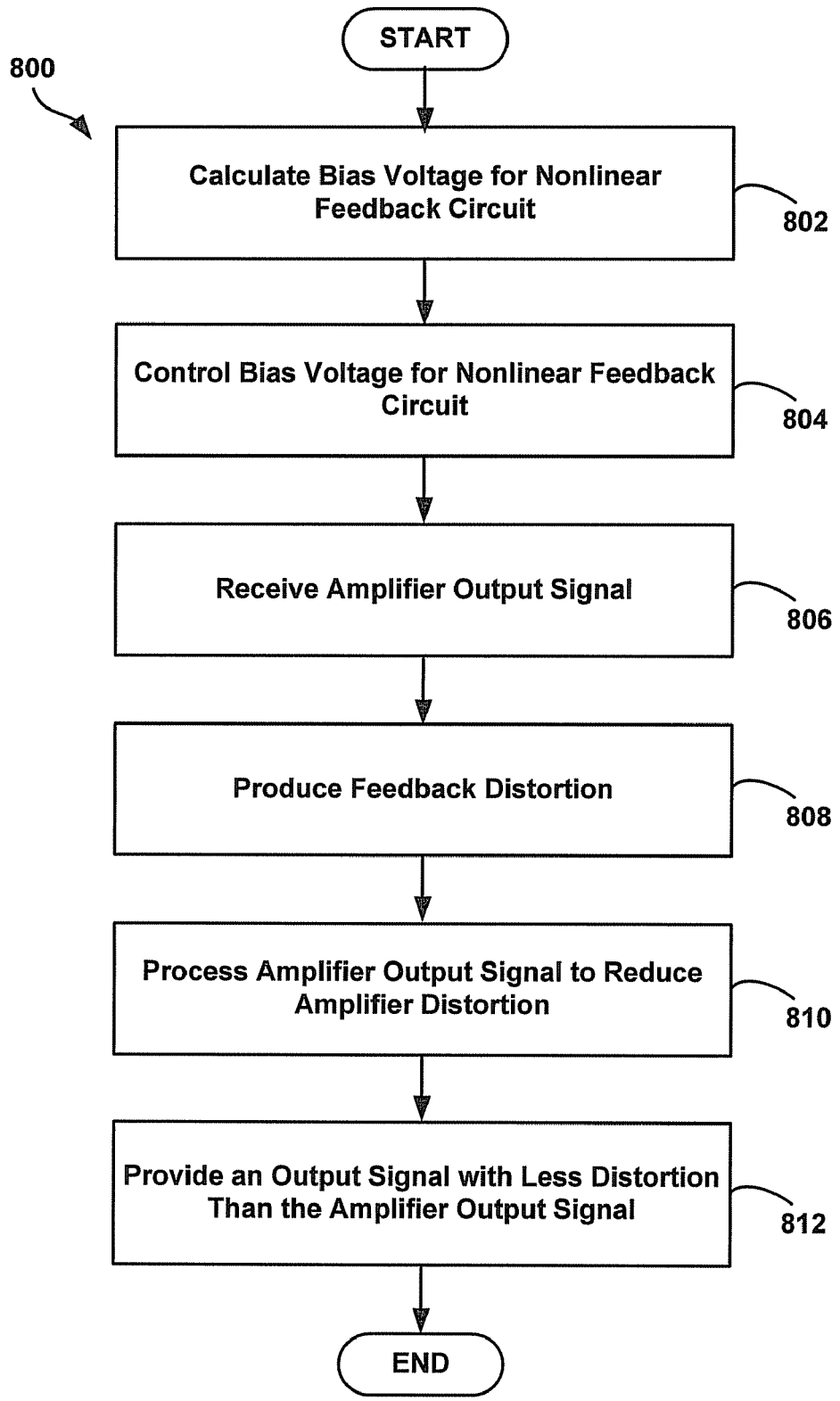
FIG. 8 illustrates an example flowchart including functional steps for reducing third harmonic distortion in an amplifier circuit.

Implementing examples of the electronic circuits discussed above, an electronic circuit can be designed to reduce certain nonlinear characteristics. FIG. 8 illustrates an exemplary flowchart including functional steps 800 for reducing the third harmonic distortion of an electronic circuit. It should be understood that the flowchart shows the functionality and operation of one possible implementation of exemplary embodiments. In this regard, each block may represent a module, a segment, or a portion of program code, which includes one or more instructions executable by a processor or computing device for implementing specific logical functions or steps in the process. The program code may be stored on any type of computer readable medium, for example, such as a storage device including a disk or hard drive, or on other types of non-transitory computer-readable media. In addition, each block may represent circuitry that is wired to perform the specific logical functions in the process. Alternative implementations are included within the scope of the exemplary embodiments of the present application in which functions may be executed out of order from that shown or discussed, including substantially concurrent or in reverse order, depending on the functionality involved, as would be understood by those reasonably skilled in the art.

FIG. 8 illustrates an example flowchart including functional steps of an example method for reducing third harmonic distortion in an amplifier circuit. The steps of the method 800 may be carried out, in whole or in part, by a computing device as shown and described by FIG. 7, for example, operating on an electronic circuit that may include a nonlinear differential amplifier coupled to a nonlinear feedback circuit. The method includes calculating a bias voltage for a transistor in a nonlinear feedback circuit, as shown at block 802. This step may be performed by running a computer simulation on a model circuit that includes a nonlinear differential amplifier coupled to a nonlinear feedback circuit. If such a nonlinear feedback circuit contains more than one transistor, then a bias voltage may be calculated for each transistor or a subset of transistors in the nonlinear feedback circuit. In addition, the step may be performed by including a bias voltage controller to adjust the bias voltage in the nonlinear feedback circuit to a level in which no distortion is observed.

At another step, a computer, signal generator, oscillator, some other device, or a combination thereof, may be used to control a bias voltage to one or more transistors in a nonlinear feedback circuit, as shown at block 804. Thus, a precise bias voltage can be applied to the one or more transistors to reduce or cancel the third harmonic distortion of an amplifier output signal.

A nonlinear feedback circuit may have an input node connected to the output node of a nonlinear amplifier. Thus, a further step in the exemplary method may be receiving an amplifier output, as shown at block 806, as an input signal to a nonlinear feedback circuit containing at least one transistor. For example, the input signal may be a current signal produced by a nonlinear amplifier that exhibits third harmonic distortion due the nonlinear effects of the amplifier. Another step in the exemplary method may be producing a feedback signal having a third harmonic component using a nonlinear feedback circuit, as shown at block 808. For example, a transistor in a nonlinear feedback circuit may produce a current signal that includes a third harmonic component. This step may be performed by operating at least one transistor in the nonlinear feedback circuit in Triode mode.

An additional step in the exemplary method may be processing the amplifier output signal by coupling the nonlinear feedback circuit in negative feedback with the nonlinear differential amplifier circuit, as shown at block 810. Negative feedback provides for the third harmonic component created by the nonlinear feedback circuit to reduce or cancel the third harmonic distortion component of the amplifier output signal. For example, the current signal produced by the nonlinear feedback circuit may combine with the amplifier current signal to reduce third harmonic distortion. A further step in the method may be to provide an output signal of an overall circuit that has less third harmonic distortion than an amplifier output signal before being processed by a nonlinear feedback circuit, as shown at block 812.

The following publications are incorporated by reference in their entirety into the present disclosure: "Low-voltage CMOS Transconductance Cell Based on Parallel Operation of Triode and Saturation Transconductors," by A. Coban and P. Allen, Electronics Letters, vol. 30, no. 14, pp. 1124-1126, July 1994 (hereinafter "Coban"); "A 1-V 50-MHz Pseudodifferential OTA with Compensation of the Mobility Reduction," by T.-Y. Lo and C.-C. Hung, IEEE Transactions on Circuits and Systems—II: Express Briefs, vol. 54, no. 12, pp. 1047-51, December 2007 (hereinafter "Lo"); "OTA Linearity Enhancement Technique for High Frequency Applications with IM3 Below −65 db," by A. Lewinski and J. Silva-Martinez, IEEE Transactions on Circuits and Systems II: Express Briefs, vol. 51, no. 10, pp. 542-548, October 2004 (hereinafter "Lewinski"); "The Design and Implementation of Low-power CMOS Radio Receivers," by D. K. Shaeffer Ph.D. dissertation, Stanford university, December 1998 (hereinafter "Shaeffer"); "A 4-MHz CMOS Continuous-time Filter with On-chip Automatic Tuning," by F. Krummenacher and N. Joehl, IEEE Journal of Solid-State Circuits, vol. 23, no. 3, pp. 750-758, June 1988 (hereinafter "Krummenacher"); "Distortion in Elementary Transistor Circuits," by W. Sansen, IEEE Transactions on Circuits and Systems—II, vol. 46, no. 3, pp. 315-325, March 1999 (hereinafter "Sansen"); "RF Microelectronics", by B. Razavi, Prentice Hall, 1998 (hereinafter "Razavi"); "Analysis and Design of Analog Integrated Circuits" by P. R. Gray, P. J. Hurst, S. H. Lewis, and R. G. Meyer. Wiley, 2001 (hereinafter "Gray"); and "MOSFET Modeling for Analog Circuit CAD: Problems and Prospects," by Y. Tsividis and K. Suyama, IEEE Journal of Solid-State Circuits, vol. 29, no. 3, pp. 210-216, March 1994 (hereinafter "Tsividis").

In general, it should be understood that the circuits described herein may be implemented in hardware using integrated circuit development technologies, or yet via some other methods, or the combination of hardware and software objects that could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Marlcush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system for reducing third harmonic distortion, the system comprising:
    an amplifier circuit having an amplifier transistor such that the amplifier circuit is capable of exhibiting an amplifier output signal having third harmonic distortion; and
    a nonlinear feedback circuit comprising a first feedback transistor, a second feedback transistor coupled in a series circuit to the first feedback transistor, and a third transistor coupled to an intermediate node between the first feedback transistor and the second feedback transistor, wherein the first and second feedback transistors and the third transistor are each configured to operate in Triode mode, wherein the first feedback transistor is configured to receive a first adjustable bias voltage and the third transistor is configured to receive a second adjustable bias voltage, the nonlinear feedback circuit configured to produce a feedback electronic signal having a feedback third harmonic component based on the first and second adjustable bias voltages, wherein the nonlinear feedback circuit is coupled to the amplifier circuit in negative feedback such that the feedback third harmonic component of the feedback electronic signal reduces the third harmonic distortion of the amplifier output signal.

2. The system of claim 1, wherein the amplifier circuit is a differential amplifier circuit.

3. The system of claim 1, further comprising a second input node coupled to the second feedback transistor, wherein the second input node is configured to receive the first adjustable bias voltage and the nonlinear feedback circuit is configured to produce the feedback electronic signal having the feedback third harmonic component.

4. The system of claim 3, further comprising a first computing device configured to provide the first and second adjustable bias voltages for the nonlinear feedback circuit and the nonlinear feedback circuit is configured to provide the feedback electronic signal having the feedback third harmonic component.

5. The system of claim 4, wherein the first computing device is configured to adjust the first and second adjustable bias voltages to determine a magnitude of the feedback third harmonic component of the feedback electronic signal that reduces the third harmonic distortion of the amplifier output signal.

6. The system of claim 1, wherein the third transistor is configured to generate a control current to provide at least a minimal voltage drop across the first and second feedback transistors.

7. The system of claim 1, wherein the first adjustable bias voltage and the second adjustable bias voltage are independently adjustable.

8. A method to reduce third harmonic distortion in an electronic device, the method comprising:
    receiving an amplifier output signal having third harmonic distortion from an output node of an amplifier circuit at an input node of a nonlinear feedback circuit;
    producing a feedback electronic signal having a feedback third harmonic component based on an adjustable first bias voltage input to the nonlinear feedback circuit, the nonlinear feedback circuit having a first feedback transistor operating in Triode mode and a first input node coupled to the first feedback transistor and configured to receive the adjustable first bias voltage, and the nonlinear feedback circuit coupled in negative feedback with the amplifier circuit such that the input node of the nonlinear feedback circuit is coupled to the output node of the amplifier circuit;
    adjusting the adjustable first bias voltage so that the feedback electronic signal includes a third harmonic component that substantially matches the third harmonic distortion of the amplifier output signal;
    processing the amplifier output signal using the nonlinear feedback circuit by combining the feedback electronic signal with the amplifier output signal to reduce the third harmonic distortion of the amplifier output signal; and
    providing an electronic device output signal having less third harmonic distortion than the amplifier output signal.

9. The method of claim 8, further comprising controlling the adjustable first bias voltage of the first feedback transistor in the nonlinear feedback circuit using a computing device wherein the nonlinear feedback circuit is capable of producing the feedback electronic signal having the feedback third harmonic component.

10. The method of claim 9, wherein the amplifier is a differential amplifier.

11. The method of claim 8, further comprising calculating a second bias voltage capable of being applied to a second feedback transistor and a third bias voltage capable of being applied to a third transistor, wherein the nonlinear feedback circuit further comprises:
    the second feedback transistor operating in Triode mode, coupled in a series circuit to the first feedback transistor, the series circuit having an intermediate node between the first feedback transistor and the second feedback transistor; and the third transistor coupled to the intermediate node between the first feedback transistor and the second feedback transistor, the third transistor operating in Triode mode.

12. The method of claim 11, further comprising controlling the second bias voltage of the second feedback transistor and the third bias voltage of the third transistor in the nonlinear feedback circuit using a computing device wherein the nonlinear feedback circuit is capable of producing the feedback electronic signal having the feedback third harmonic component.

13. A non-transitory computer-readable medium having stored thereon, computer-executable instructions that, when executed by a device, cause the device to perform functions comprising:

receiving an amplifier output signal having third harmonic distortion from an output node of an amplifier circuit at an input node of a nonlinear feedback circuit;

producing a feedback electronic signal having a feedback third harmonic component based on an adjustable first bias voltage input to the nonlinear feedback circuit, the nonlinear feedback circuit having a first feedback transistor operating in Triode mode and a first input node coupled to the first feedback transistor and configured to receive the adjustable first bias voltage, and the nonlinear feedback circuit coupled in negative feedback with the amplifier circuit such that the input node of the nonlinear feedback circuit is coupled to the output node of the amplifier circuit;

adjusting the adjustable first bias voltage so that the feedback electronic signal includes a third harmonic component that substantially matches the third harmonic distortion of the amplifier output signal;

processing the amplifier output signal using the nonlinear feedback circuit by combining the feedback electronic signal with the amplifier output signal to reduce the third harmonic distortion of the amplifier output signal; and providing a device output signal having less third harmonic distortion than the amplifier output signal.

14. The non-transitory computer-readable medium of claim 13, wherein the functions further comprise controlling the adjustable first bias voltage of the first feedback transistor in the nonlinear feedback circuit using a computing device wherein the nonlinear feedback circuit is capable of producing the feedback electronic signal having the feedback third harmonic component.

15. The non-transitory computer-readable medium of claim 14, wherein the functions further comprise calculating a second bias voltage capable of being applied to a second feedback transistor and a third bias voltage capable of being applied to a third transistor using the first computing device, wherein the nonlinear feedback circuit further comprises:

the second feedback transistor operating in Triode mode, coupled in a series circuit to the first feedback transistor, the series circuit having an intermediate node between the first feedback transistor and the second feedback transistor; and the third transistor coupled to the intermediate node between the first feedback transistor and the second feedback transistor, the third transistor operating in Triode mode.

16. The non-transitory computer-readable medium of claim 15, wherein the functions further comprise controlling the second bias voltage of the second feedback transistor and the third bias voltage of the third transistor in the nonlinear feedback circuit using a second computing device wherein the nonlinear feedback circuit is capable of producing the feedback electronic signal having the feedback third harmonic component.

17. The non-transitory computer-readable medium of claim 13, wherein the amplifier is a differential amplifier.

* * * * *

UNITED STATES PATENT AND TRADEMARK OFFICE
CERTIFICATE OF CORRECTION

PATENT NO. : 8,063,701 B2
APPLICATION NO. : 12/649474
DATED : November 22, 2011
INVENTOR(S) : Amrutur et al.

It is certified that error appears in the above-identified patent and that said Letters Patent is hereby corrected as shown below:

On Page 2, in Field (56), under "OTHER PUBLICATIONS", in Column 1, Lines 1-2, delete "nalysis and Design of Analog Integrated Circuits by P. R. Gray, P. J. OTA Linearity" and insert -- OTA Linearity --, therefor.

On Page 2, in Field (56), under "OTHER PUBLICATIONS", in Column 2, Lines 2-4, delete "Hurst, S. H. Lewis,...................808-865." and insert -- Analysis and Design of Analog Integrated Circuits by P. R. Gray, P. J. Hurst, S. H. Lewis, and R. G. Meyer, Wiley, 2001, Ch. 2.9, p. 131-143; Ch. 3.5, p. 215-245; Ch. 4.3.5, p. 287-298; Ch. 6.1, p. 405-418, and Ch. 12, p. 808-865. --, therefor as a new Entry in Line 3.

In Column 1, Line 18, delete "asymmetrical" and insert -- asymmetrical digital --, therefor.

In Column 1, Line 41, delete "(UV)" and insert -- (I/V) --, therefor.

In Column 4, Line 35, in Equation (3), delete "$sin(3\omega_i t)$" and insert -- $sin(3\omega_1 t)$ --, therefor.

In Column 9, Line 18, delete "$I_{out}=(I_{di}-I_{d2})-I_{df}$," and insert -- $I_{out}=(I_{d1}-I_{d2})-I_{df}$, --, therefor.

In Column 15, Line 42, delete "Meyer." and insert -- Meyer, --, therefor.

In Column 17, Line 16, delete "Marlcush" and insert -- Markush --, therefor.

Signed and Sealed this
Nineteenth Day of June, 2012

David J. Kappos
*Director of the United States Patent and Trademark Office*

UNITED STATES PATENT AND TRADEMARK OFFICE
CERTIFICATE OF CORRECTION

PATENT NO.        : 8,063,701 B2  
APPLICATION NO.   : 12/649474  
DATED             : November 22, 2011  
INVENTOR(S)       : Amrutur et al.

Page 1 of 1

It is certified that error appears in the above-identified patent and that said Letters Patent is hereby corrected as shown below:

On the Cover Page, item (73), under "Assignee", in Column 1, Line 1, delete "Science" and insert -- Science, Bangalore --, therefor.

Signed and Sealed this
Twenty-ninth Day of January, 2013

David J. Kappos
*Director of the United States Patent and Trademark Office*